(12) United States Patent
Ishibashi et al.

(10) Patent No.: US 7,211,152 B2
(45) Date of Patent: *May 1, 2007

(54) HEATING ELEMENT CVD SYSTEM AND CONNECTION STRUCTURE BETWEEN HEATING ELEMENT AND ELECTRIC POWER SUPPLY MECHANISM IN THE HEATING ELEMENT CVD SYSTEM

(75) Inventors: Keiji Ishibashi, Fuchu (JP); Masahiko Tanaka, Fuchu (JP); Minoru Karasawa, Fuchu (JP); Hideki Sunayama, Fuchu (JP); Kazutaka Yamada, Fuchu (JP); Hideki Matsumura, Kanazawa (JP); Atsushi Masuda, Kanazawa (JP)

(73) Assignee: Anelva Corporation, Fuchu-Shi, Tokyo (JP)

( * ) Notice: Subject to any disclaimer, the term of this patent is extended or adjusted under 35 U.S.C. 154(b) by 361 days.

This patent is subject to a terminal disclaimer.

(21) Appl. No.: 10/673,238

(22) Filed: Sep. 30, 2003

(65) Prior Publication Data

US 2004/0065260 A1    Apr. 8, 2004

(30) Foreign Application Priority Data

Oct. 4, 2002    (JP)    ............................. 2002-292402

(51) Int. Cl.
- *C23C 16/00* (2006.01)
- *F27B 5/14* (2006.01)
- *F27D 11/00* (2006.01)

(52) U.S. Cl. .............................. 118/724; 118/723 HC; 118/50.1; 219/390; 219/490; 219/541

(58) Field of Classification Search ................ 219/390, 219/409, 541, 405, 411; 118/723 HC, 723 R, 118/724

See application file for complete search history.

(56) References Cited

U.S. PATENT DOCUMENTS

| 5,112,466 | A  | * | 5/1992  | Ohta et al. ............. 204/298.05 |
| 6,069,094 | A  | * | 5/2000  | Matsumura et al. ......... 438/788 |
| 6,325,857 | B1 | * | 12/2001 | Miyoshi ..................... 118/724 |
| 6,432,206 | B1 | * | 8/2002  | Tolt .......................... 118/724 |
| 6,593,548 | B2 | * | 7/2003  | Matsumura et al. ........ 219/390 |

FOREIGN PATENT DOCUMENTS

| JP | 03239320 A   | * | 10/1991 |
| JP | 11054441 A   | * | 2/1999  |
| JP | 2000114256 A | * | 4/2000  |
| JP | 2002093713 A | * | 3/2002  |
| JP | 2005048273 A | * | 2/2005  |
| WO | WO 200225712 A1 | * | 3/2002 |

* cited by examiner

Primary Examiner—Karla Moore
(74) Attorney, Agent, or Firm—Buchanan Ingersoll & Rooney PC

(57) ABSTRACT

A heating element CVD system wherein one or a plurality of connection terminal holders is placed in the processing container, and each of the connection terminal holders holds a plurality of connection terminals. Each of the connection terminals connects the heating element to the electric power supply mechanism electrically such that a connection region of the heating element connected to the connection terminal is not exposed to a space in the processing container.

8 Claims, 8 Drawing Sheets

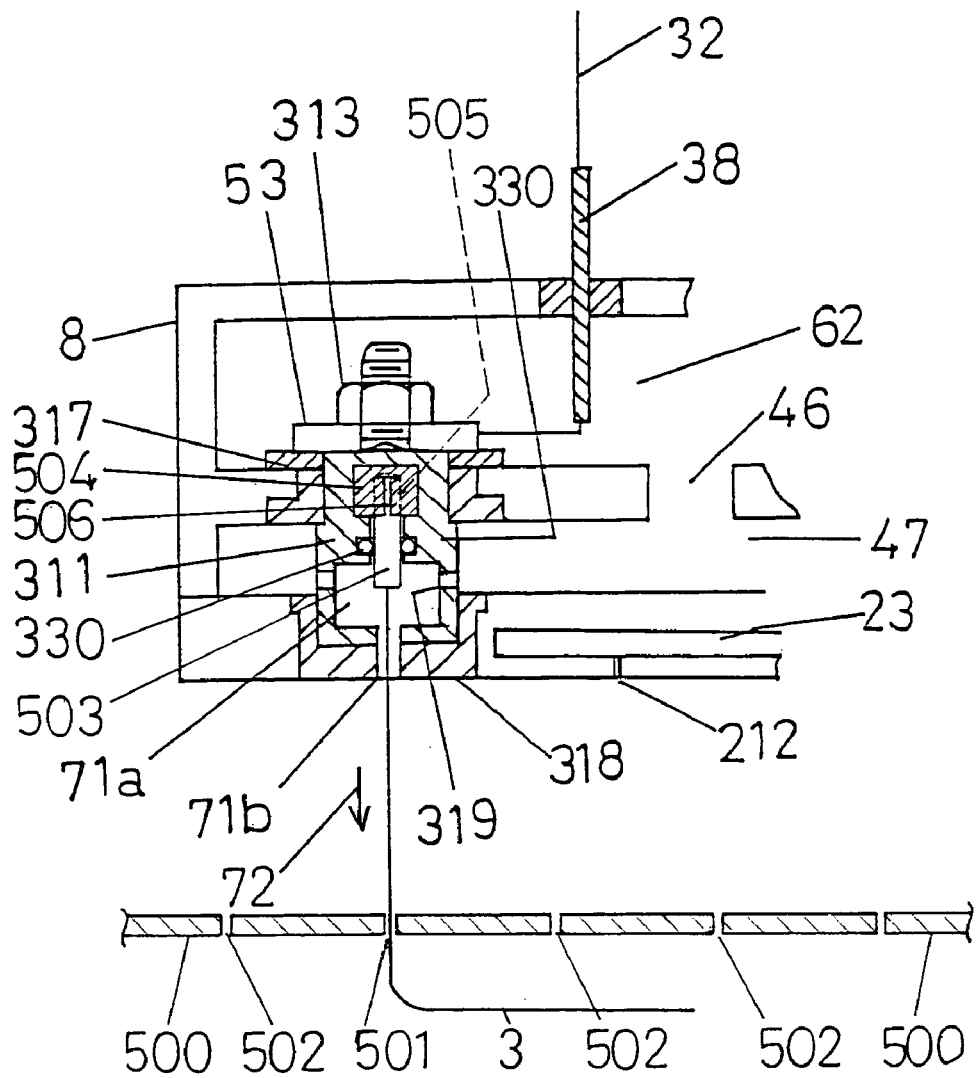
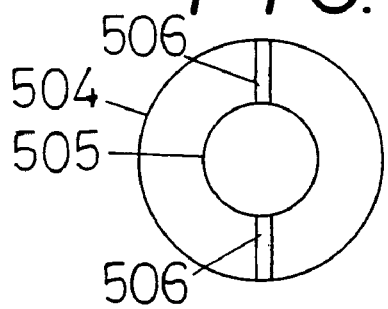
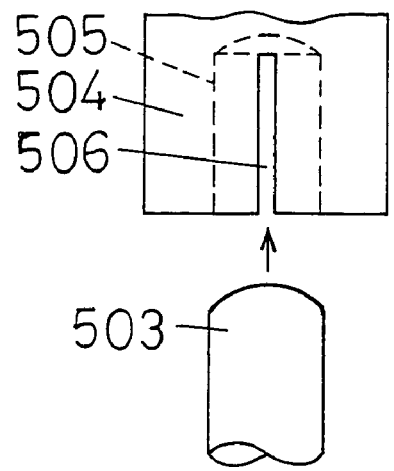

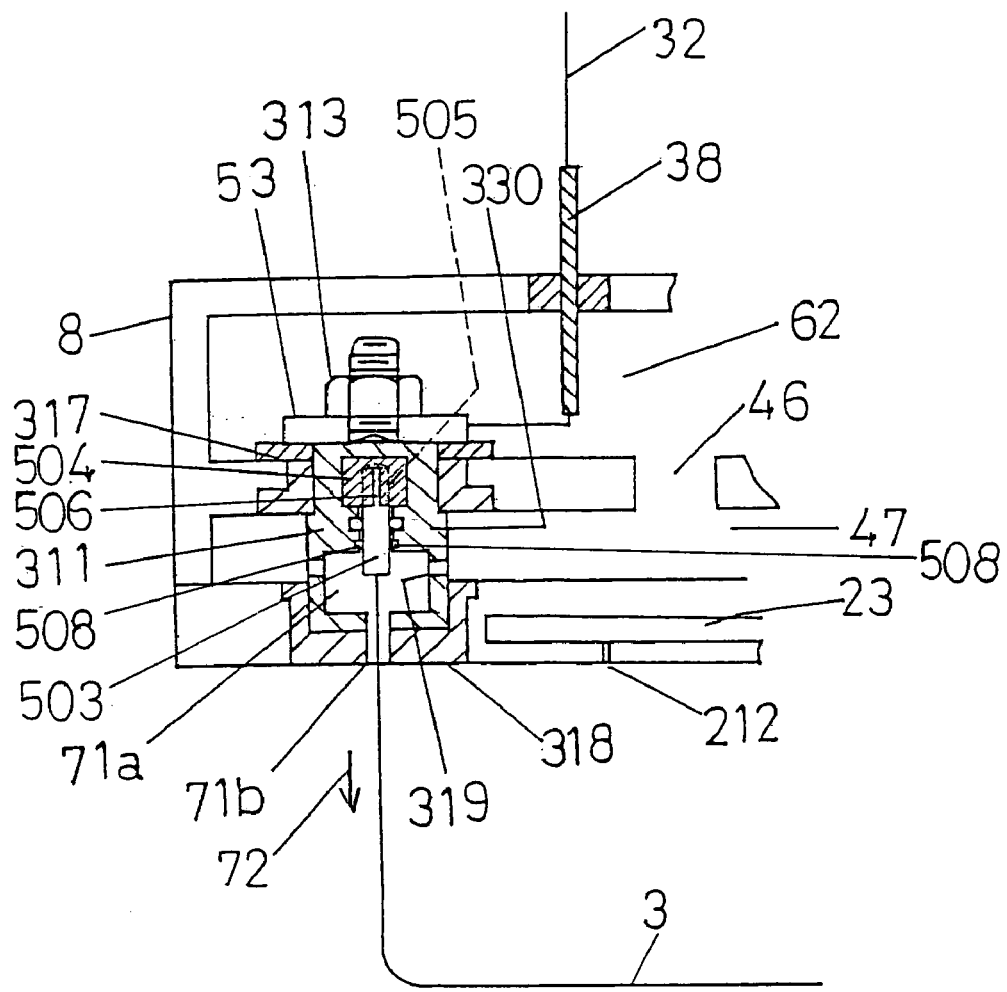
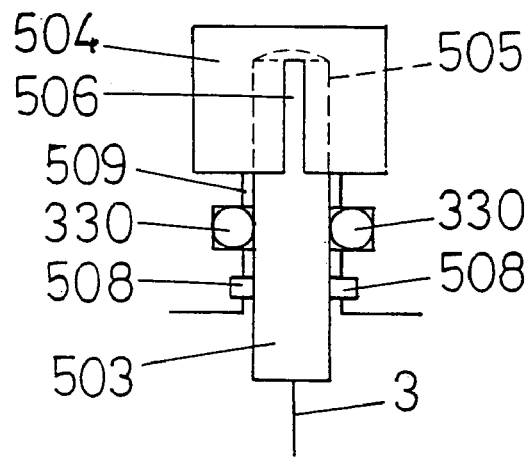
FIG. 5(a)
FIG. 5(b)

HEATING ELEMENT CVD SYSTEM AND CONNECTION STRUCTURE BETWEEN HEATING ELEMENT AND ELECTRIC POWER SUPPLY MECHANISM IN THE HEATING ELEMENT CVD SYSTEM

BACKGROUND OF THE INVENTION

1. Field of the Invention

The present invention relates to a heating element CVD system in which a heating element kept at a specified temperature is disposed in a vacuum chamber (processing container) and in which a raw material gas is decomposed and/or activated by the above-mentioned heating element to deposit a thin film on a substrate placed in the vacuum chamber (processing container) and to a structure for connecting a heating element to an electric power supply mechanism in a heating element CVD system.

2. Description of the Related Art

In manufacturing various kinds of semiconductor devices including an LSI (large scale integrated circuit), an LCD (liquid crystal display) and the like, CVD (chemical vapor deposition) methods have been widely used for forming a predetermined thin film on a substrate.

For example, in a plasma CVD method, a raw material gas is decomposed and/or activated in discharged plasma to form a thin film. In a thermal CVD method, a substrate is heated to induce a chemical reaction to form a thin film, and so on. In addition, there exists a CVD method in which a raw material gas is decomposed and/or activated by a heating element kept at a predetermined high temperature to form a thin film (hereinafter referred to as a heating element CVD method).

In a film forming system for performing the heating element CVD method (hereinafter referred to as a heating element CVD system), a heating element made of a refractory metal such as tungsten or the like is disposed in a processing chamber which can be evacuated to a vacuum. A raw material gas is introduced into the evacuated processing chamber while the heating element is kept at high temperatures from about 1000° C. to 2000° C.

The introduced raw material gas is decomposed and/or activated when it passes over the surface of the heating element. Then, the decomposed and/or activated raw material gas reaches a substrate to deposit a thin film of the material, which is a final objective material, on the surface of the substrate. In this connection, in the heating element CVD methods, a CVD method using a wire-shaped heating element is called as a Hot Wire CVD method, and a CVD method utilizing a catalytic reaction of a heating element for decomposing and/or activating the raw material gas by the heating element is called a catalytic CVD (or Cat-CVD) method.

In the heating element CVD method, the raw material gas is decomposed and/or activated when it passes over the surface of the heating element. For this reason, this method has an advantage of reducing the temperature of the substrate as compared with a thermal CVD method in which reaction is induced only by the heat of the substrate. Further, in the heating element CVD method, plasma is not produced, as it is produced in the plasma CVD method. For this reason, there is no worry that plasma causes damage to the substrate. Accordingly, the heating element CVD method is thought to be a promising candidate as a film forming method for a semiconductor device, a display device and the like of the next generation in which high integration and high functionality have been increasingly developed.

FIG. 7 shows a conceptional view of a conventional heating element CVD system. In a processing container 1, a predetermined processing of forming a thin film is performed on a substrate (not shown). An evacuation system 11 for evacuating the processing container 1 to a vacuum and a specified raw material gas supply system 21 for supplying a raw material gas into the processing container 1 for forming a thin film are connected to the processing container 1. In the processing container 1, a heating element 3 is disposed such that the raw material gas supplied into the processing container 1 passes over the surface of it. An electric power supply mechanism 30 for supplying electric power is connected to the heating element 3, thereby the heating element 3 is heated and kept at a predetermined temperature (a high temperature of about 1600° C. to 2000° C.) required for the heating element CVD method. Further, in the processing container 1, a gas supply unit 2 is arranged in a manner opposite to the heating element 3.

Further, in the processing container 1, a predetermined thin film is formed on the substrate (not shown) by the raw material gas decomposed and/or activated by the heating element 3 that is kept at the predetermined high temperature described above. For this reason, in the processing container 1, a substrate holder 4 is provided for holding the above-mentioned substrate (not shown).

In FIG. 7, it is a gate valve for carrying the substrate into or out of the processing container 1 that is denoted by a reference character 5. Further, the substrate holder 4 is provided with, as is conventionally known, a heating mechanism for heating the substrate, but this heating mechanism will not be shown or described because it is not important in the present invention.

In this connection, in the embodiment shown in FIG. 7, although it is not shown, the raw material gas supply system 21 includes a cylinder filled with the raw material gas, a supply pressure regulator, a flow regulator, a supply/stop switching valve, and the like. The raw material gas is supplied by the raw material gas supply system 21 into the processing container 1 via the gas supply unit 2 provided in the processing container 1.

Further, in a process using two or more kinds of raw material gases, the raw material gas supply systems 21 of the number equal to the number of kinds of gases used are connected in parallel to the gas supply unit 2.

The gas supply unit 2, as described above, is arranged in face with the heating element 3 in the processing container 1. Further, the gas supply unit 2 has a hollow structure and many gas blowing holes 210 on a surface facing the substrate holder 4.

On the other hand, the evacuation system 11 is connected to the processing container 1 via a main valve 12 having an evacuation speed regulating function. The pressure in the processing container 1 is controlled by this evacuation speed regulating function.

In the heating element CVD method, the substrate (not shown) is a substance to be subjected to a predetermined processing of forming a thin film. This substrate (not shown) is carried in and out of the processing container 1 via the gate valve 5.

The above-mentioned heating element 3 is generally formed of a wire-shaped member and is bent in the shape of sawtooth and is held by a support body 31, the surface of which is at least made of an insulator. Further, a power supply line 32 from the electric power supply mechanism 30 is connected to the heating element 3 by a connection terminal 33. An electric power is supplied to the heating element 3 via this connection terminal 33 to heat the heating element 3 to the predetermined temperature required for the heating element CVD method and to keep it at the predetermined temperature.

Usually, a direct current power source or an alternating current power source is used as the electric power supply mechanism 30. The heating element 3 is supplied with electric power from the power source and is set at the predetermined temperature by the passage of the electric current. By heating the heating element 3 to a high temperature, the raw material gas is decomposed and/or activated to effectively form a thin film.

Usually, the heating element 3 is heated to a predetermined temperature (usually, in a film forming process, a high temperature of about 1600° C. to 2000° C.) by the passage of the electric current, so a refractory metal is used as the material for the heating element 3 and, in general, tungsten is used.

A case where a silicon film is formed and a case where a silicon nitride film is formed will be described as examples of forming a thin film by the heating element CVD system shown in FIG. 7. The processes are proceeded as follows.

First, a mixed gas of silane ($SiH_4$) and hydrogen ($H_2$) is used in the case where the silicon film is formed. A mixed gas of silane and ammonia ($NH_3$) is used in the case where the silicon nitride film is formed. The pressure in the processing container 1 is about from 0.1 Pa to 100 Pa. In both cases, the temperature of the heating element 3 is set at a predetermined temperature (usually, a high temperature of about from 1600° C. to 2000° C. in a film forming process), and the temperature of the substrate (not shown) held by the substrate holder 4 is set at a temperature of about from 200° C. to 500° C. by a heating mechanism (not shown) in the substrate holder 4.

In the case where the silicon film or the silicon nitride film is formed under predetermined film forming conditions by the use of a conventional heating element CVD system described above, the following phenomenon is produced. A refractory metal used for the heating element, for example, a tungsten wire described above or the like sometimes reacts with the silane gas to form a silicon compound (hereinafter referred to silicide formation).

A silicide formation mentioned above proceeds from near a connection terminal 33 that is the connection part by which electric power is supplied from the electric power supply mechanism 30 (that is, the connection region of the heating element 3). In the above-mentioned connection region of the heating element 3, the temperature of the heating element 3 becomes lower than 1600° C. at the film forming process. Further, in the above-mentioned connection region of the heating element 3, the reaction speed of the raw material gas with the heating element 3 is faster than the desorption speed of decomposed and/or activated gas species of the raw material gas and raw material gas itself.

The above-mentioned silicide formation changes the composition and the diameter of the heating element 3 and reduces the resistance thereof. As a result, the heating power is reduced and the whole heating element is finally deteriorated. Also, it reduces a film forming speed as hours of use of the heating element is elongated. Further, since the products of the silicide and the like have high vapor pressures in general, they contaminate the deposited film and degrade the quality of the silicon film formed or the silicon nitride film formed as the deterioration of heating element is proceeding.

Therefore, it is necessary to break the vacuum in the processing container 1 to the atmospheric pressure and to change the heating element 3 when a predetermined number of substrates are processed. This change of the heating element 3 results in a problem in productivity.

FIG. 8 is a view showing a part of a support body 31 of a conventional embodiment. In the part of the support body 31 of the conventional embodiment, the heating element 3 is supported by the support body 31 by means of a wire 34 (usually, made of molybdenum) to reduce a contact area of the heating element 3 thereby reducing thermal conduction. The conventional embodiment shown in FIG. 8 is intending to prevent silicide formation, which proceeds from the part of the heating element 3 where its temperature is slightly low.

However, even in this method, the temperature of the heating element 3 at the part in contact with the wire 34 drops inevitably, so that the silicide formation at and from the above-mentioned portion is caused, depending on film forming conditions such as a high silane gas pressure in case of forming the silicon film or the like.

Further, even in this method, it is impossible to eliminate connection to the electric power supply line 32, so that the silicide formation is also caused at the part of the connection terminal 33 as is the case shown in FIG. 7. Therefore, even in a heating element CVD system adopting the constitution shown in FIG. 8, it is necessary to break the vacuum in the processing container 1 to the atmospheric pressure and to change the heating element 3 when a predetermined number of substrates are processed. The change of the heating element 3 results in a problem in productivity.

On the other hand, if films are repeatedly formed in the heating element CVD system, the films are deposited also on the inside of the processing container and are peeled off and results in the cause of the particulate problem. The inventors of the present application proposed a method of effectively removing a film deposited on the inside of a processing container, which becomes an origin of particulates, and an in situ cleaning method of a heating element CVD system (Japanese Patent Application Laid-Open (JP-A) No. 2001-49436).

According to this disclosed method, the gas supply unit 2 of the conventional heating element CVD system shown in FIG. 7 is provided with a cleaning gas supply system having the same constitution as the raw material gas supply system 21, and when cleaning the system, instead of a raw material gas used in forming a film, a cleaning gas is introduced into the processing container 1 via the gas supply unit 2. That is, after the processing container 1 is evacuated, a heating element 3 disposed in the processing container 1 is heated to and kept at a temperature of 2000° C. or more, and a cleaning gas which is decomposed and or activated by the heating element 3 to produce activated species which in turn react with a deposited film to change it into a gaseous substance is introduced into the processing container 1, and the produced gaseous substance is exhausted from the processing container 1 to remove the deposited film from the inside surface of processing container. This method has been made based on findings that when the heating element 3 is kept at a temperature of 2000° C. or more, the heating element 3 itself does not react with the cleaning gas but remains stable.

However, after the above-mentioned method was made, it turned out that even if it was tried to keep the heating element 3 at a temperature of 2000° C. or more, a part near the connection terminal 33, which is the connection part of electric power supply from the electric power supply mechanism 30 to the heating element 3, became low in temperature, and that as the deposited film was being removed, the part was etched by the cleaning gas and was gradually reduced in diameter and finally broken by the reaction of the said part with the cleaning gas. Thus, it is necessary to replace the heating element at a certain time, which results in a problem in productivity.

Further, it was found that in the case where a film was deposited on a large-area substrate of over 1 m by the use of the heating element CVD system shown in FIGS. 7 and 8, there was a room for improvement in the uniformity of thickness of a thin film deposited.

To be more specific, in the Cat-CVD method, in the case where in order to form a film on a large-area substrate by the use of the heating element CVD system shown in FIGS. 7 and 8, a conventional technique is adopted in which a sawtooth heating element 3 droops due to a large-size support frame as large as the substrate, there is presented a problem that the heating element 3 is drooped by thermal expansion. That is, since the sawtooth heating element 3 is thermally expanded by about 1% when it is heated to 1800° C., if the heating element 3 having a length of 1 m is used to form a film on the large-area substrate, the heating element 3 is drooped by 70 mm at the maximum by a thermal expansion of 1%. In the worst case, it is estimated that the heating element 3 is drooped more than the distance between the substrate and the heating element 3, which is usually set at about 50 mm. According to the inventor study, it is found that the gap (distance) between the heated heating element 3 and the substrate subjected to a film forming process greatly affects the uniformity of a film thickness when the film is formed.

At present, it is anticipated that the size of a next-generation glass substrate will be larger than 1 m. For example, it is planned to use a large substrate of 1100 mm by 1250 mm for an LCD and 900 mm by 455 mm for a solar cell. In order to form a film on such a large-area substrate, it is necessary to reduce the degree of drooping of the heating element 3 caused by the thermal expansion mentioned above and to ensure the uniformity of thickness of the film formed on the large-area substrate, so that the present applicant already proposed an improved heating element CVD system (International Publication No. 02/25712 Pamphlet=U.S. Pat. No. 6,593,548 B2.)

This improved heating element CVD system makes it possible to prevent the heating element from being degraded by the raw material gas in a connection region of the heating element connected to the electric power supply mechanism in the heating element CVD system in which the raw material gas introduced into the processing container (vacuum chamber) is decomposed and/or activated by the heating element to deposit the thin film on the substrate arranged in the processing container (vacuum chamber). Also, this improved heating element CVD system makes it possible to prevent the heating element from reacting with the cleaning gas at the time of cleaning for removing the deposited film on the inside of the processing container in the connection region of the heating element connected to the electric power supply mechanism in the heating element CVD system. Then, this makes it possible to provide a heating element CVD system excellent in mass production in which the life of the heating element can be elongated and in which a film forming environment can be stabilized.

Further, this makes it possible to respond to forming a film on a large-area substrate more than 1 m and to provide a heating element CVD system that can ensure the uniformity of the film thickness even in a case where the film is formed on such a large-area substrate.

SUMMARY

The present inventors further have studied the above-mentioned improved heating element CVD system, which was proposed previously, to further improve film characteristics and a connection structure between the heating element and the electric power supply mechanism. Then, the inventors have completed this invention for the purpose of further improving the stability of the heating element CVD system.

An embodiment of a heating element CVD system to which this invention is applied is a heating element CVD system which includes: a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from an electric power supply mechanism, thereby being heated to high temperatures. In this heating element CVD system, the raw material gas introduced into the processing container from the raw material gas supply system is decomposed and/or activated by the heating element kept at high temperatures to form a thin film on the substrate held by the substrate holder. Also, in this heating element CVD system, one or a plurality of connection terminal holders is placed in the processing container; each of the said connection terminal holders holds a plurality of connection terminals at a predetermined position with electrical insulation therebetween; each of said connection terminals connects the heating element to the electric power supply mechanism electrically; the heating elements connected to the connection terminals are supported in face with the substrate holder; and a connection region of the heating element connected to the connection terminal is not exposed to a space in the processing container.

The embodiment of the heating element CVD system of this invention is characterized in that in the above-mentioned mode, a shield plate having heating element passing holes and a plurality of through holes is further provided. The heating element can pass through the heating element passing hole in a non-contact manner. And a gas can pass through the said through holes. The said shield plate is arranged between a part of the heating element extending into the processing container through the heating element passing hole and a surface of a connection terminal holder facing with the inside of processing container.

Next, a connection structure between a heating element and an electric power supply mechanism in a heating element CVD system relates to a heating element CVD system which includes: a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from the electric power supply mechanism, thereby being heated to high temperatures, and in which the raw material gas introduced into the processing container from the raw material gas supply system is decomposed and/or activated by the heating element kept at the high temperatures to form a thin film on the substrate held by the substrate holder. The connection structure is applied to the structure of connection part between the heating element and the electric power supply mechanism which electrically connects the heating element to the electric power supply mechanism via a connection terminal and does not expose the connection region of the heating element connected to the connection terminal to a space in the processing container.

An embodiment of the connection structure between the heating element and the electric power supply mechanism, is characterized in that in the above-mentioned mode, a connection pin is provided at the end portion of the heating element and that the above-mentioned connection terminal is provided with a pin receiver having a small hole, through which the connection pin provided at an end portion of the heating element is inserted or removed, the inside diameter of the small hole is smaller than the diameter of the connection pin, and a slit extending laterally to the direction in which the connection pin is inserted into or removed from the small hole is provided on its peripheral wall forming the small hole.

The before-described connection structure between the heating element and the electric power supply mechanism can be modified into a mode having a structure in which the connection terminal has a connection terminal inside hollow portion provided on a side facing with inside of the processing container and communicating with the above-mentioned pin receiver through a heating element passing hole, and a gas passing hole provided at a part facing with inside of the processing container for communicating the connection terminal inside hollow portion with the processing container. Thereby, the heating element connected to the connection terminal passes through the gas passing hole in a noncontact manner, so that the connection region of the heating element connected to the connection terminal can be prevented from being exposed to a space in the processing container. And a spacer interposed between the inside peripheral wall of the heating element passing hole and the connection pin at the end portion of the heating element is arranged on the side of an opening facing the connection terminal inside hollow portion of the said heating element passing hole.

In each of the above-mentioned embodiments of the connection structures between a heating element and an electric power supply mechanism, which is proposed by the invention, it can be modified into a mode in which one or a plurality of connection terminal holders placed in the processing container holds a plurality of connection terminals at a predetermined position with electrical insulation therebetween and connects the heating element to the electric power supply mechanism electrically in which the said heating elements connected to the connection terminals are supported in face with the substrate holder and a connection region of the heating element connected to the connection terminal is not exposed to the space in the processing container.

Still another embodiment of a connection structure between a heating element and an electric power supply mechanism, which is proposed by the invention, is applied to a heating element CVD system which includes: a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from the electric power supply mechanism, thereby being heated to high temperatures; and in which the raw material gas introduced into the processing container from the raw material gas supply system is decomposed and/or activated by the heating element kept at the high temperatures to form a thin film on the substrate held by the substrate holder. And the said connection structure between a heating element and an electric power supply mechanism of the still another invention has the following structure.

One or a plurality of connection terminal holders placed in the processing container holds a plurality of connection terminals at a predetermined position with electrical insulation therebetween and connects the heating element to the electric power supply mechanism electrically in which the said heating element connected to the connection terminals are supported in face with the substrate holder.

Each of the above-mentioned connection terminal holders has a first inside hollow portion to which a gas introduction system for introducing gas is connected, and each of the plurality of connection terminals held by a connection terminal holder at a predetermined position with electrically insulating therebetween has a connection terminal inside hollow portion on a side facing the inside of processing container and a gas passing hole which makes the said connection terminal inside hollow portion communicate with the space in the processing container and through which the heating element connected to the connection terminal is passed in a noncontact manner, thereby the connection region of the heating element connected to the connection terminal is prevented from being exposed to the space in the processing container.

The above-mentioned connection terminal inside hollow portion is made to communicate with the first inside hollow portion of the above-mentioned connection terminal holder, and the connection part between the connection terminal and the electric power supply mechanism, or the connection part between the connection terminal and the electric power supply mechanism and a wiring part for electrically connecting the connection terminal and the other connection terminal is arranged in the above-mentioned first inside hollow portion.

An insulator is arranged so as to cover a part facing the above-mentioned first inside hollow portion of the connection part and the wiring part, and/or a surface of the connection terminal holder facing the above-mentioned first inside hollow portion is covered with an insulator.

An embodiment of the present invention can be used for a heating element CVD system comprised as follows. In this heating element CVD system, a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from an electric power supply mechanism, thereby being heated to high temperatures; and in which the raw material gas introduced into the processing container from the raw material gas supply system is decomposed and/or activated by the heating element kept at high temperatures to form a thin film on the substrate held by the substrate holder; and in which one or a plurality of connection terminal holders is placed in the processing chamber, each of said connection terminal holders holds a plurality of connection terminals at predetermined position with electrically insulating therebetween; each of the connection terminals connects the heating element to the electric power supply mechanism electrically; the heating element connected to the connection terminal are supported in face with the substrate holder; and a connection region of the heating element connected to the connection terminal is not exposed to a space in the processing container.

In an embodiment of the heating element CVD system of the present invention, a shield plate is further provided with the before described heating element CVD system. This shield plate has heating element passing holes and a plurality of through holes. The heating element passes the heating element passing holes in a noncontact manner. And a gas can pass the through holes. The shield plate is arranged between a part of the heating element extending into the processing container through the heating element passing holes and a surface of the connection terminal holder facing with inside of the processing container.

Thus, in an embodiment of the heating element CVD system of the present invention, the connection terminal holders are not heated by the radiant heat of the heating element.

Thus, even if a case where the sealing member, such as the O ring, is used in the connection terminal holder, the temperature of the connection terminal holder can be prevented from exceeding the heat resistance temperature of the sealing member, so that it is possible to improve the stability of the heating element CVD system. Further, if the connection terminal holder is cooled by the cooling mechanism in order to prevent the temperature of the connection terminal holder from exceeding the heat resistance temperature of the sealing member, the film is deposited on the surface of the shield plate facing the inside of the processing container and heated by the radiant heat of the heating element, and the shield plate is heated at this time, so that the deposited film does not react with the H radicals, and the amount of H radicals in the processing container does not decrease, which results in preventing the film characteristics from being degraded.

Further, in the above-mentioned embodiment of the heating element CVD system of the present invention, by improving the connection structure between the heating element and the electric power supply mechanism, it is possible to improve stability.

BRIEF DESCRIPTION OF THE DRAWINGS

FIG. 3(a) shows a connection structure in an embodiment of the invention between a heating element and an electric power supply mechanism in a heating element CVD system and is a partially enlarged cross sectional view of a part indicated by "A" in FIG. 2. FIG. 3(b) shows a pin receiver when viewed from the bottom side in FIG. 3(a). FIG. 3(c) is a side view illustrating a state where a connection pin is inserted in the pin receiver with parts partially omitted;

FIG. 5(a) shows another connection structure in accordance with an embodiment of the invention between the heating element and the electric power supply mechanism in the heating element CVD system and corresponds to FIG. 3(a). FIG. 5(b) is an enlarged view of a part in FIG. 5(a);

DESCRIPTION OF THE PREFERRED EMBODIMENTS

Preferred embodiments of the present invention will hereinafter be described on the basis of the accompanying drawings.

Figure 1:
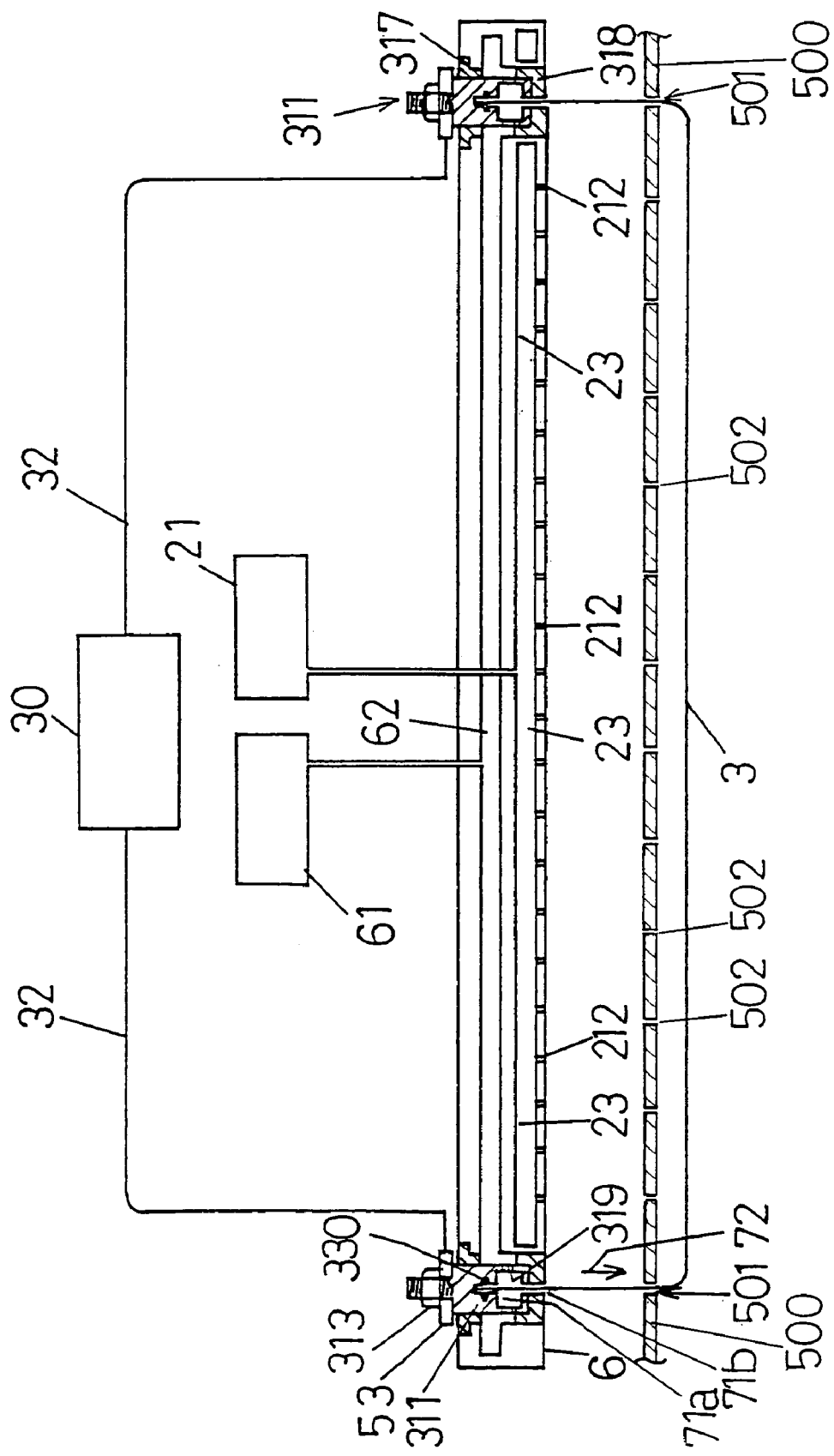
FIG. 1 shows a cross-sectional structure of a connection part between a heating element and an electric power supply mechanism in one preferred embodiment of a heating element CVD system of the invention.
Figure 2:
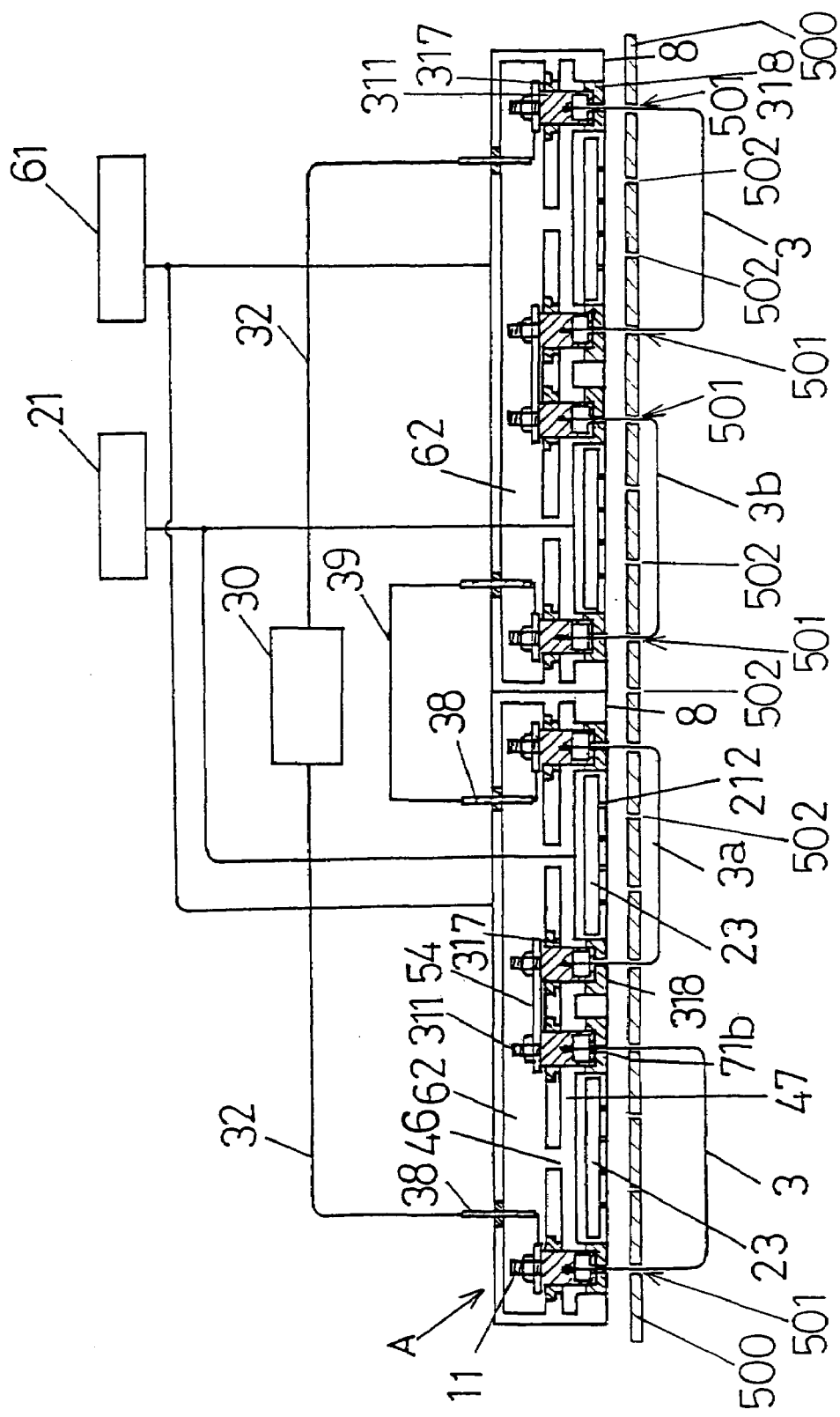
FIG. 2 shows a cross-sectional structure of a connection part between a heating element and an electric power supply mechanism in another preferred embodiment of a heating element CVD system of the invention.

FIGS. 1 and 2 show a cross-sectional structure of a connection part between a heating element and an electric power supply mechanism in a preferred embodiment of a heating element CVD system in accordance with the invention.

Figure 7:
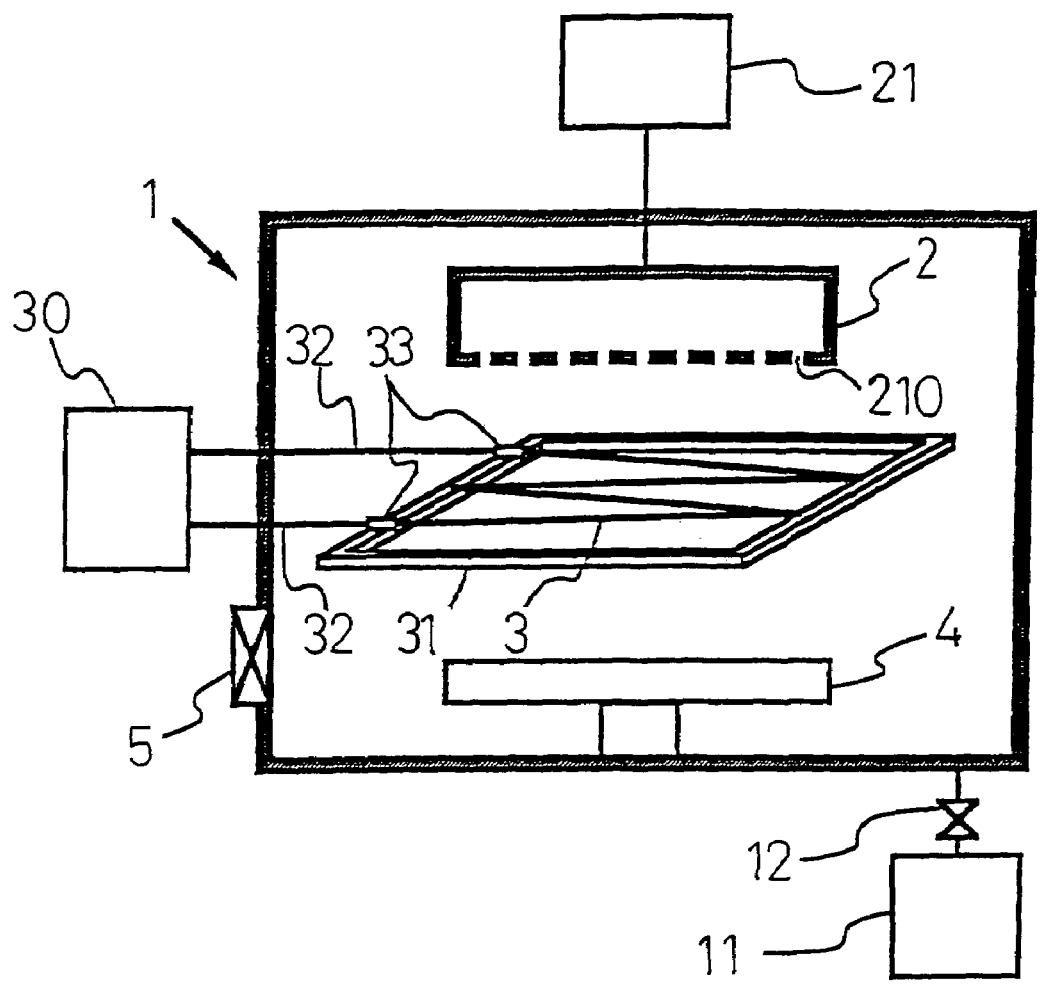
FIG. 7 is a conceptional view showing a constitution example of a conventional heating element CVD system.

The structures of a processing container 1, a substrate holder 4, and an evacuation system 11 and the like in a heating element CVD system in accordance with the invention are the same as those of the above-mentioned conventional heating element CVD system shown in FIG. 7, and hence are omitted in the drawings. Further, same reference numerals are attached to members similar to the members shown in FIG. 7.

In the embodiment shown in FIG. 1, a connection terminal 311 is held by a connection terminal holder 6 having a first inside hollow portion 62 therein with electrical insulation by insulators 317 and 318.

In the embodiment shown in FIG. 2, a connection terminal 311 is held by a connection terminal holder 8 having a first inside space 62 therein with electrical insulation by insulators 317 and 318.

In the embodiment shown in FIG. 1, a power supply line 32 from the electric power supply mechanism 30 is connected to a power supply plate 53. The power supply plate 53 is sandwiched between a nut 313 and the connection terminal 311. On the other hand, the end portion of a heating element 3 is pressed onto and connected to the connection terminal 311 by a coil spring 330.

In this manner, the end portion of the power supply line 32 from the electric power supply mechanism 30 is connected to the end portion of the heating element 3 via the connection terminal 311.

Each of the connection terminal holders 6 (FIG. 1) and 8 (FIG. 2) supports the heating element 3 such that the heating element 3 faces a substrate holder 4. And each of the connection terminal holders 6 and 8 is a structural body independent of a processing container 1. Also, each of these connection terminal holders 6, 8 is connected to the electric power supply mechanism 30, a raw material gas supply system 21 and a gas introduction system 61.

The connection terminal 311 has a connection terminal inside hollow portion 71a at the side toward the inside of the processing container 1 (lower side in FIGS. 1 and 2) and has a gas passing hole 71b, through which the connection terminal inside hollow portion 71a communicates with the inside of the processing container 1, in a part facing the processing container 1.

The heating element 3 is connected to the connection terminal 311 through these gas passing holes 71*b* and the connection terminals inside hollow portion 71*a* in a state where it is not put into contact with the connection terminal 311 at the part of the gas passing hole 71*b* and the connection terminal inside hollow portion 71*a*.

As described above, in this structure, the connection region of the heating element 3 connected to the connection terminal 311 is not exposed to a space in the processing container 1. With this structure, when the film is formed, it is possible to prevent a raw material gas such as a silane gas or the like from contacting the connection region of the heating element 3 connected to the connection terminal 311 (a part of heating element 3 where its temperature is slightly low), and when a deposited film is removed (a cleaning operation is performed), it is possible to prevent a cleaning gas from contacting the connection region of the heating element 3 connected to the connection terminal 311 (a part of heating element 3 where its temperature is slightly low).

Gas can be passed, by a gas passage 319, between the connection terminal inside hollow portion 71*a* and the first inside hollow portion 62 in the connection terminal holder 6. Further, there is provided a gas introduction system 61 for introducing gas into the first inside hollow portion 62 in the connection terminal holder 6.

In the embodiment shown in FIG. 1, the gas passage 319 is drawn at the side of the connection terminal 311 where the heating element 3 is connected, but it is possible to face the gas passage 319 to the part where the heating element 3 is just connected to the connection terminal 311.

The gas introduction system 61 is a gas introduction system for introducing any one gas of hydrogen, argon, helium, neon, krypton, xenon, nitrogen, or ammonia, or a mixed gas containing two or more kinds of these gases. This gas supply system 61 has the same constitution as the raw material gas introduction system 21 shown in FIG. 7.

In the embodiment shown in FIG. 1, as described above, the gas (purge gas) introduced by the gas introduction system 61 is introduced into the processing container 1 through the first inside hollow portion 62, the gas passage 319, the connection terminal inside hollow portion 71*a* and the gas passing hole 71*b*.

Accordingly, when the film is formed, it is possible to further effectively prevent the raw material gas such as a silane gas or the like from contacting the connection region of the heating element 3 connected to the connection terminal 311 (the part of the heating element 3 where its temperature is slightly low). Further, when the deposited film is removed (the cleaning operation is performed), it is possible to further prevent the cleaning gas from contacting the connection region of the heating element 3 connected to the connection terminal 311 (the part of the heating element 3 where its temperature is slightly low).

Further, in the embodiments shown in FIGS. 1 and 2, each of the connection terminal holders 6 and 8 has a second inside hollow portion 23. A raw material gas supply system 21 is connected to this second inside hollow portion 23. Also, the second inside hollow portion 23 has a plurality of gas blowing-out openings 212 made in the surface on the side facing the substrate holder 4. The second inside hollow portion 23 communicates with the space in the processing container 1 only through the gas blowing-out openings 212. That is, as shown in FIGS. 1 and 2, the first inside hollow portion 62 is separated from the second inside hollow portion 23.

In this connection, while only one heating element 3 is shown in the embodiment shown in FIG. 1, the number of the heating elements 3 is arbitrarily selected and, needless to say, the connection terminal holder 6 is provided with the connection terminals 311 of the number corresponding to the number of the heating elements 3.

In the embodiment shown in FIG. 1, the raw material gas is supplied into the processing container 1 through the gas blowing-out openings 212 from the second inside hollow portion 23. Therefore, even if a substrate to be processed has a large area, by enlarging the connection terminal holder 6 and increasing the number of the heating elements 3, the raw material gas can be supplied to the whole surface of the large-area substrate, whereby a uniform film can be formed. That is, this embodiment can easily be applied to a substrate having a large area.

The hydrogen gas can be introduced, as shown by an arrow 72, into the processing container 1 from the gas supply system 61 through the first inside hollow portion 62 of the connection terminal holder 6, the gas passage 319, the connection terminal inside hollow portion 71*a*, and the gas passing hole 71*b*.

This flow of the hydrogen gas can prevent the silane gas, introduced into the processing container 1 from the raw material gas supply unit 21, and/or the activated species originated from the silane gas, which are decomposed and/or activated on the surface of the heating element 3, from entering into the connection terminal inside hollow portion 71*a* through the gas passing hole 71*b*. This can prevent the silane gas and/or the activated species originated from the silane gas from contacting the connection terminal 311 of the heating element 3, thereby preventing a part of the heating element 3, where its temperature is slightly low, from being changed to a silicide and degraded.

In the above-mentioned embodiment in accordance with the invention, when a film deposited on the inside of the processing container 1 is removed (cleaned), the respective gases are introduced as follows.

In the case of the embodiment shown in FIG. 1, the cleaning gas is introduced into the processing container 1 from a cleaning gas supply system (not shown), the construction of which is similar to the raw material gas supply system 21, through the second inside hollow portion 23 and the gas lowing-out openings 212, and any one gas of hydrogen, argon, helium, neon, krypton, xenon, nitrogen, or ammonia, or a mixed gas of two or more kinds of these gases is introduced, as shown by the arrow 72, into the processing container 1 from the gas supply system 61 through the first inside hollow portion 62 of the connection terminal holder 6, the gas passage 319, the connection terminal inside hollow portion 71*a*, and the gas passing hole 71*b*.

This can prevent the cleaning gas itself and/or the activated species originated from the cleaning gas, which are decomposed and/or activated on the surface of the heating element 3, from entering into the connection terminal inside hollow portion 71*a*. Thus, it is possible to prevent the part of the heating element 3 where its temperature is slightly low (the connection region of the heating element 3 connected to the connection terminal 311) from being etched and degraded.

Each of FIGS. 2 and 3 shows a cross sectional structure of the connection part between the heating element and the electric power supply mechanism in another embodiment in which a plurality of connection terminal holders 6, described in FIG. 1, are provided in the processing container 1.

Figure 8:
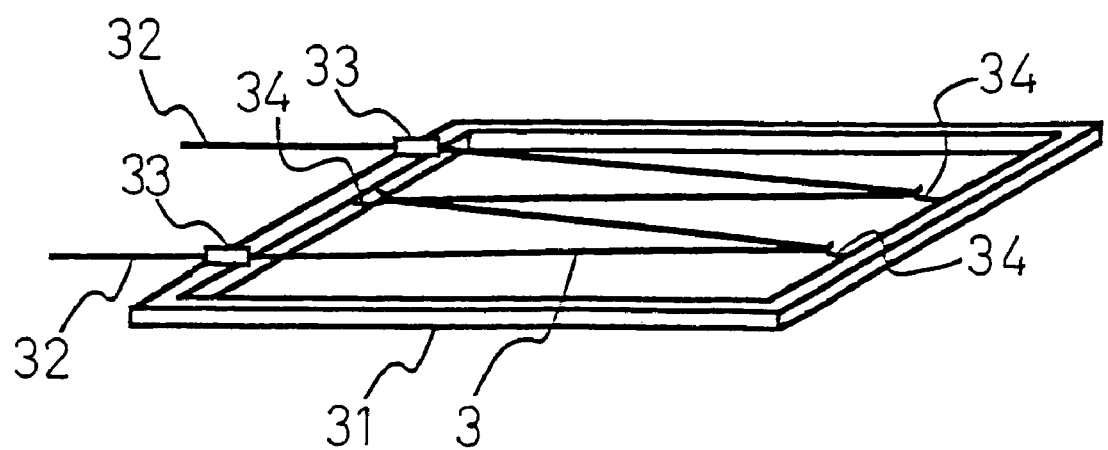
FIG. 8 is a conceptional view showing the constitution of a heating element of another constitution example of a conventional heating element CVD system.

The part shown in this FIG. 2 corresponds to the part shown in FIG. 1. FIG. 3(*a*) shows in detail the part A indicated in FIG. 2. As is the case with FIG. 1, the structures of the processing container 1, the substrate holder 4, the evacuation system and the like are the same as those of the conventional heating element CVD system shown in FIGS. 7 and 8. Therefore, their illustrations and descriptions will be omitted.

In the embodiment shown in FIG. 2, a nut 313 fixes the connection terminal 311 to the connection terminal holder 8 and, at the same time, connects the connection terminal 311 to the power supply plates 53, 54.

The basic structure and construction in the embodiment shown in FIG. 2 is the same as those in the embodiment shown in FIG. 1. Therefore, in FIG. 2, the same reference numerals are attached to the members similar to members shown in FIG. 1 and their descriptions will be omitted.

In the embodiments shown in FIGS. 1 to 3, the heating element 3 is connected to and held by the connection terminal 311 by a coil spring 330. With this coil spring 330, the heating element 3 can be mounted on or dismounted from the connection terminal 311 with a single motion.

The embodiment shown in FIG. 2 is different from the embodiment shown in FIG. 1 in that two connection terminal holders 8 are disposed in the processing container 1 and that the connection part connecting the connection terminal and the electric power supply mechanism and the wiring part for electrically connecting the connection terminals are built in the connection terminal holder 8. Then, the difference in the structure between the embodiment shown in FIG. 2 and the embodiment shown in FIG. 1 will specifically be described in the following.

In the embodiment shown in FIGS. 2 and 3, the connection part connecting the connection terminal 311 and the electric power supply mechanism 30 is covered with the first inside hollow portion 62. This can prevent the connection part connecting the connection terminal 311 and the electric power supply mechanism 30 from being exposed to the space in the processing container 1. Further, also the power supply plate 54 (between the connection terminals) that is the wiring portion for electrically connecting the connection terminals is covered with the first inside hollow portion 62. Thereby, the power supply plate 54 can be prevented from being exposed to the space in the processing container 1.

In the embodiment shown in FIGS. 2 and 3, the connection terminal 311 is provided with a gas passage 319 for connecting an inside hollow portion 47 in the connection terminal holder 8 to the connection terminal inside hollow portion 71a. Thus, the gas introduced from the gas introduction system 61 fills the first inside hollow portion 62 and is introduced into the next inside hollow portion 47 through an inside hollow portion penetrating hole 46. The gas is further flowed into the connection terminal inside hollow portion 71a in the connection terminal 311 through the gas passage 319. Then, the gas passes near the heating element 3 and the coil spring 330 to the non-contact part between the heating element 3 connected to the connection terminal 311 and the connection terminal holder 8. That is, the gas flows to the space in the processing container 1 through the gas passing hole 71b, as shown by the arrow 72.

The heating element CVD system shown in FIGS. 1 and 2, is characterized in that a shield plate 500 is arranged on a side (bottom side in FIGS. 1 and 2) facing the inside of the processing container 1, that is, 6 (FIG. 1) and 8 (FIG. 2) respectively.

The shield plate 500 has heating element passing holes 501 and a plurality of through holes 502. The heating element 3 can pass through the heating element passing holes 501 in a noncontact manner. And the gas can pass through the through holes 502.

As shown in FIGS. 1 and 2, the heating element 3 extends through the heating element passing holes 501 into the processing container 1, so that the shield plate 500 is arranged between the part of the heating element 3 extending into the processing container 1 through the heating element passing holes 501 and a surface of the connection terminal holder 6 or 8 facing the inside of the processing container 1.

In the heating element CVD system, a sealing member (not shown) such as an O ring needs to be used, for example, in order to completely separate the first inside hollow portion 62 from the second inside hollow portion 23 in the connection terminal holder 6 or 8 and to completely separate these hollow portions 62 and 23 from the space in the processing container 1, or in a case where a structural body such as the connection terminal 311 is arranged in the inside hollow portion 47 of the connection terminal holder 8.

However, since the connection terminal holder 6 or 8 is heated by the radiant heat of the heating element 3, in some cases, its temperature far exceeds the heat resistance temperature of the sealing member such as the O ring (150° C. for Viton and 280° C. for top-rated Kalrez). In this case, the connection terminal holder 6 or 8 needs to be cooled to a temperature lower than the heat resistance temperature of the sealing member such as the O ring, for example, by a cooling mechanism (not shown).

On the other hand, in a case where a Si film is formed by using $SiH_4$ or $SiH_4+H_2$ as a raw material gas in a Cat-CVD system, H radicals have a significant effect on the film characteristics. Thus, when the connection terminal holder 6 or 8 is cooled to the temperature lower than the heat resistance temperature of the sealing member such as the O ring, as described above, the H radicals produced when the raw material gas is put into contact with and decomposed by the heating element 3 react with the film deposited on the surface of the connection terminal holder 6 or 8. As a result, there is a possibility that the amount of H radicals in the processing container 1 might decrease to degrade the film characteristics. Further, there is also a possibility that a substance produced by the before described reaction of the H radicals with the film deposited on the surface of the connection terminal holder 6 or 8 as well as the other substance produced by decomposition and activation of the before described substance by the heating element 3 are also taken into the film formed on the substrate placed on the substrate holder 4, thereby the film characteristics is degraded.

According to the heating element CVD system shown in FIGS. 1, 2 and 3(a), the shield plate 500 is arranged between the part of the heating element 3 extending into the processing container 1 through the heating element passing hole 501 of the shield plate 500 and the surface of the connection terminal holder 6 or 8 facing the inside of the processing container 1, so that the connection terminal holder 6 or 8 is not heated by the radiant heat of the heating element 3.

As a result, although any cooling mechanism is not used, it is possible to prevent the temperature of the connection terminal holder 6 or 8 from exceeding the heat resistance temperature of the sealing member such as the O ring.

In addition, the film is deposited on the surface of the shield plate 500 facing the inside of the processing container 1 and heated by the radiant heat of the heating element 3. And at this time, the shield plate 500 is heated, thus, the deposited film does not react with the H radicals, and hence the amount of H radicals in the space in the processing container 1 does not decrease, which can prevent the deterioration of the film characteristics.

It is possible to connect the shield plate 500 to a temperature adjusting mechanism (not shown) and to keep the shield plate 500 at a predetermined temperature (250° C. to 500° C.).

Next, a connection structure between the heating element 3 and the electric power supply mechanism 30 that is distinctive in the heating element CVD system of an embodiment of the invention will be described.

As shown in FIG. 3(a), a connection pin 503 is provided on the end of the heating element 3. On the other hand, the connection terminal 311 has a pin receiver 504 having a small hole 505 through which the connection pin 503 is inserted or removed. The inside diameter of the small hole 505, as shown in FIG. 3(c), is smaller than the diameter of the connection pin 503. As shown in FIGS. 3(b) and 3(c), the peripheral wall of the pin receiver 504 forming the small hole 505 is provided with slits 506 extending laterally to the direction in which the connection pin 503 is inserted or removed. In this connection, FIG. 3(b) illustrates the pin receiver 504 when it is viewed from the direction in which the connection pin 503 is inserted or removed (from the bottom side in FIGS. 3(a) and FIG. 3(c) is a side view showing the state where the connection pin 503 is inserted into the pin receiver 504, parts being partially omitted for clearness.

A wire-shaped material having a diameter of about 0.5 mm is usually used as the heating element 3. Thus, since the heating element 3 is connected to the connection terminal 311 by the connection structure in which the connection pin 503 is provided on the end of the heating element 3 and is inserted into or removed from the small hole 505 of the pin receiver 504 provided on the connection terminal 311, the diameter of the connection part can be enlarged as compared with a case where the end of the heating element 3 provided with no connection pin 503 is connected to the connection terminal 311, whereby an electric contact area can be enlarged.

In a case where the end of the heating element 3, usually having a small diameter, is connected to the connection terminal 311, the contact area is small, so that the end of the heating element 3 is heated by contact resistance. Thus, there is a possibility that the spring ability of the coil spring 330 for keeping the electric contact with the heating element 3 and holding the heating element 3 might be degraded by the heat generated.

However, in the present invention, by connecting the heating element 3 to the connection terminal 311 via the connection pin 503 provided on the end of the heating element 3, as described above, it is possible to enlarge the electric contact area and hence to reduce contact resistance and thus to prevent heat from being generated by the contact resistance.

Further, the inside diameter of the small hole 505, which is made in the pin receiver 504 of the connection terminal 311 in which the connection pin 503 provided on the end of the heating element 3 is inserted, is smaller than the diameter of the connection pin 503, and the slits 506 extending laterally to the direction in which the connection pin 503 is inserted or removed are formed in the peripheral wall of the pin receiver 504 forming the small hole 505. Thus, the pin receiver 504 is formed as a pin receiver having a spring ability.

Then, when the connection pin 503 is inserted in the small hole 505 of the pin receiver 504 from the direction shown by an arrow in FIG. 3(c), a good thermal contact between the connection terminal 311 and the connection pin 503 can be achieved by the above-mentioned spring ability to dissipate heat from the heating element 3 heated by passing electric current to the connection terminal 311 to thereby prevent the connection pin 503 from being heated. This can more effectively prevent the possibility that the spring ability of the coil spring 330 for keeping the electric contact with the heating element 3 and holding the heating element 3 from being degraded.

Also, a good thermal contact as well as a better electric connection can be achieved by inserting the connection pin 503 provided on the end of the heating element 3 into the small hole 505 of the pin receiver 504 having the above-mentioned spring ability, thereby it can further reduce the contact resistance and prevent excessive heating caused by the contact resistance.

FIGS. 5(a) and 5(b) illustrates another connection structure between the heating element 3 and the electric power supply mechanism 30.

Figure 4:
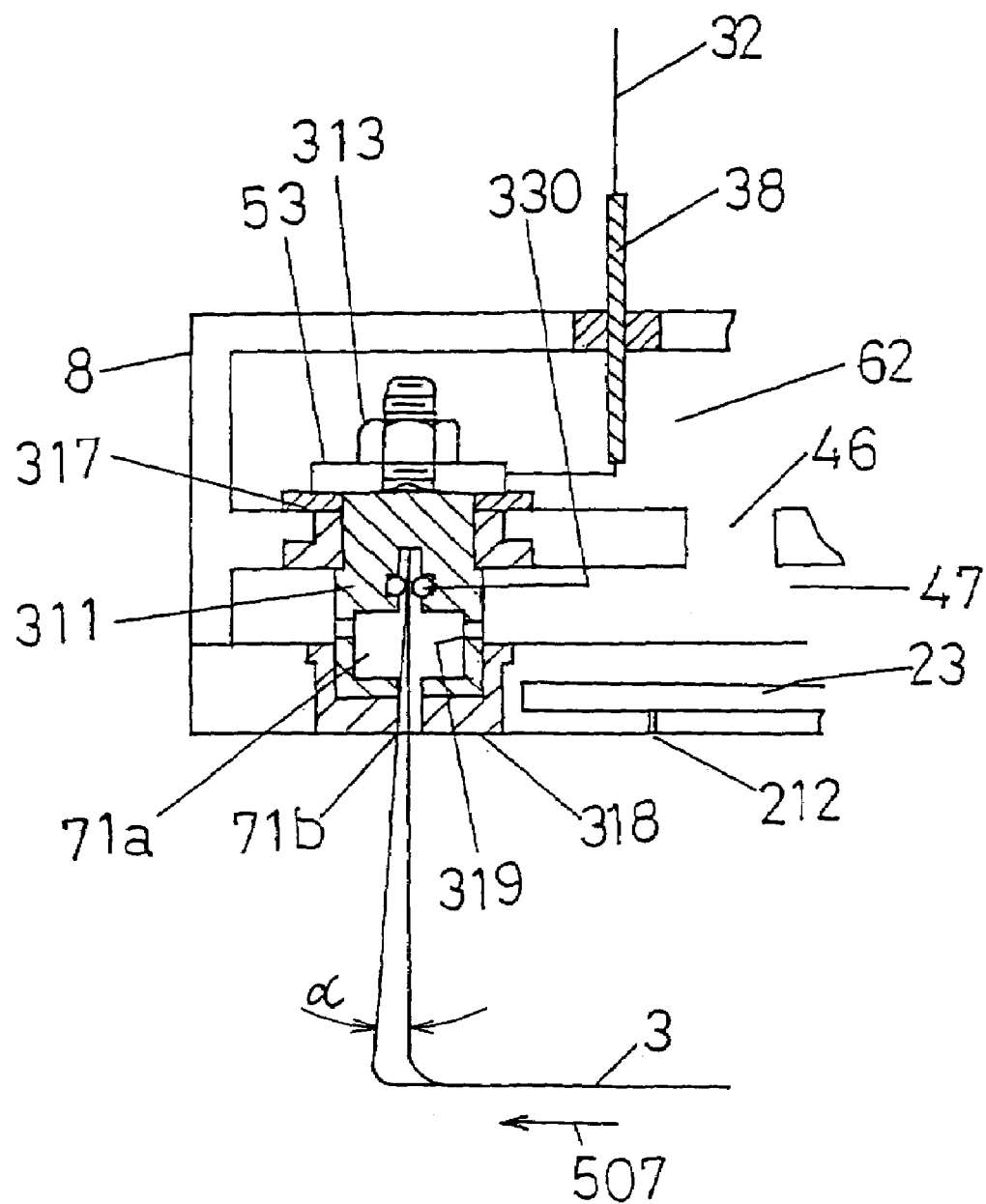
FIG. 4 is an enlarged view showing a possible state caused in a case where the heating element is thermally expanded and elongated in a lateral direction.

In a case where the heating element 3 is supported by the coil spring 330, if a thermal expansion in the direction indicated by a reference symbol 507 in FIG. 4 of the heating element 3 becomes large, there is a possibility that the heating element 3 will contact an insulator 318 at the gas passing hole 71b. Such contact reduces the temperature of the heating element 3 at the contacted part and hence causes a problem of silicide formation in case of forming the film and a problem of etching in case of cleaning.

In the connection structure between the heating element 3 and the electric power supply mechanism 30 shown in FIGS. 5(a) and 5(b), in addition to the connection structure described by the use of FIGS. 3(a) to 3(c), a spacer 508 is provided. This spacer 508 is arranged between the inner peripheral wall of the heating element passing hole 509 and the connection pin 503 on the opening side facing the connection terminal inside hollow portion 71a of the heating element passing hole 509 connecting the connection terminal inside hollow portion 71a and the pin receiver 504.

According to this structure, the heating element 3 is fixed at least at two positions of the pin receiver 504 and the spacer 508, so that the inclination a of the heating element 3 caused by thermal expansion in the direction indicated by the arrow 507 can be reduced. Thus, even in a case where the elongation caused by the thermal expansion in the direction indicated by the arrow 507 in FIG. 4 of the heating element 3 is enlarged, it is possible to exclude the possibility that the heating element 3 might be put into contact with the insulator 318 at the gas passing hole 71b.

Figure 6:
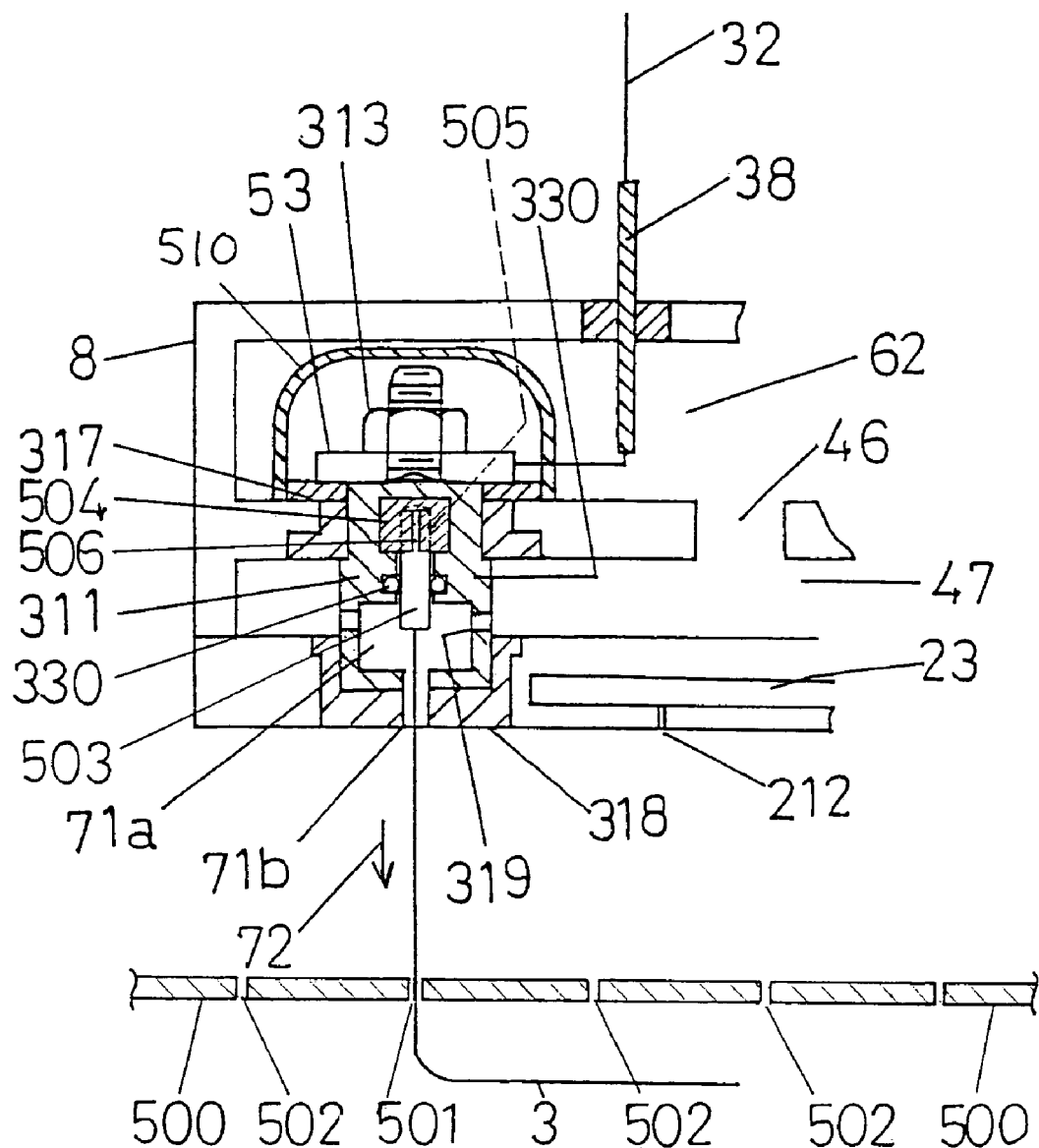
FIG. 6 shows still another connection structure in accordance with an embodiment of the invention between the heating element and the electric power supply mechanism in the heating element CVD system.

FIG. 6 shows still another connection structure of the heating element 3 and the electric power supply mechanism 30.

In the embodiment shown in FIG. 2, the connecting part between the connection terminal 311 and the electric power supply mechanism 30 is covered with the first inside hollow portion 62. This structure prevents the connecting part between the connection terminal 311 and the electric power supply mechanism 30 from being exposed to the space in the processing container 1. Further, an electric power supply plate 54 (between the connection terminals) that is a wiring portion for electrically connecting the connection terminal to the other connection terminal is also covered with the first inside hollow portion 62. Thereby the electric power supply plate 54 is also prevented from being exposed to the space in the processing container 1.

The purging gas is introduced into the first inside hollow portion 62 and the inside hollow portion 47 in the connection terminal holder 8, so that the pressure in them is increased. In this case, there is a possibility that electric discharges might be caused between the connection terminal 311 and the inside peripheral wall of the connection terminal holder 8, between the connection terminals 311, and between the electric power supply plates 53, 54 and the inside peripheral wall of the connection terminal holder 8. The occurrence of this electric discharge raises the problem that an appropriate electric power cannot be supplied to the heating element 3.

In the connection structure shown in FIG. 6, in order to prevent the occurrence of this kind of electric discharge, an insulator 510 is arranged so as to cover a part facing the first inside hollow portion 62 of the connection portion and wiring portion of the connection terminal 311 and the electric power supply mechanism 30 such as the connection terminal 311 and the electric power supply plates 53 and 54. Although it is not shown, covering a surface facing the first inside hollow portion 62 of the connection terminal holder 8 with the insulator is also effective in preventing the occurrence of the above mentioned electric discharge. Further, as shown in FIG. 6, in addition to arranging the insulator 510 so as to cover the portion facing the first inside hollow portion 62 of the connection portion and wiring portion of the connection terminal 311 and the electric power supply mechanism 30, covering a surface facing the first inside hollow portion 62 of the connection terminal holder 8 is also effective in preventing the occurrence of the above-mentioned electric discharge. By arranging the insulators in this manner, even if the pressure is increased by introducing the purging gas into the first inside hollow portion 62 and the inside hollow portion 47, it is possible to prevent the risk of causing the electric discharge.

In this connection, the connection structure employing the insulator 510 in the embodiment shown in FIG. 3(*a*) has been described in FIG. 6, but it is also possible to employ the insulator 510 as shown in FIG. 6 in the embodiment shown in FIG. 5(*a*) having a spacer 508.

Up to this point, the preferred embodiments of the invention have been described with reference to the accompanying drawings. However, the invention is not limited to these embodiments, but can be modified in various embodiments within the technical scope grasped from the appended claims.

What is claimed is:

1. A heating element CVD system comprising:
    a processing container in which a predetermined processing is performed to a substrate held by a substrate holder disposed therein;
    an evacuation system which is connected to the processing container and evacuates the processing container to a vacuum;
    a raw material gas supply system for supplying a predetermined raw material gas into the processing container; and
    a heating element which is disposed in the processing container and is supplied with electric power from an electric power supply mechanism, thereby being heated to high temperatures;
    wherein the raw material gas introduced into the processing container from the raw material gas supply system is decomposed and/or activated by the heating element kept at high temperatures to form a thin film on the substrate held by the substrate holder;
    wherein one or a plurality of connection terminal holders is placed in the processing container, each of the connection terminal holders holds a plurality of connection terminals at a predetermined position with electrical insulation therebetween; each of the connection terminals connects the heating element to the electric power supply mechanism electrically; the heating element connected to the connection terminals is supported facing the substrate holder; and a connection region of the heating element connected to the connection terminal is not exposed to a space in the processing container, and
    further comprising a shield plate having a heating element passing hole through which the heating element passes in a noncontact manner and a plurality of through holes for passing gas is arranged between a part of the heating element extending into the processing container through the heating element passing hole and a surface of the connection terminal holder facing the inside of processing container.

2. A connection structure between a heating element and an electric power supply mechanism in a heating element CVD system which comprises a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from the electric power supply mechanism, such that the heating element is heated to high temperatures; and wherein the raw material gas introduced into the processing container from the raw material gas supply system is decomposed and/or activated by the heating element kept at the high temperatures to form a thin film on the substrate held by the substrate holder; the connection structure comprising:
    a connection terminal for connecting the heating element to the electric power supply mechanism such that a connection region of the heating element connected to the connection terminal is not exposed to a space in the processing container;
    a connection pin provided at an end portion of the heating element; and
    the connection terminal is provided with a pin receiver having a small hole, through which the connection pin provided at the end portion of the heating element is inserted or removed and the inside diameter of which is smaller than a diameter of the connection pin, and a slit laterally to a direction in which the connection pin is inserted or removed is provided on the peripheral wall of the said small hole forming the said small hole.

3. The connection structure between the heating element and the electric power supply mechanism in the heating element CVD system as claimed in claim 2, wherein the connection terminal has a connection terminal inside hollow portion provided on a side facing the inside of the processing container and communicating with the pin receiver through a heating element passing hole and a gas passing hole for making the connection terminal inside hollow portion communicate with the space in the processing container at a part facing the inside of processing container and in which the heating element connected to the connection terminal is passed through the gas passing hole in a noncontact manner, thereby the connection region of the heating element connected to the connection terminal is prevented from being exposed to the space in the processing container, and
    wherein a spacer is interposed between the inside peripheral wall of the heating element passing hole and the connection pin at the end portion of the heating element, and the spacer is arranged on a side of an opening facing the connection terminal inside hollow portion of the heating element passing hole.

4. A connection structure between a heating element and an electric power supply mechanism in a heating element CVD system which comprises a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from the electric power supply mechanism, thereby being heated to high temperatures; and wherein the raw material gas introduced into the processing container from the raw material gas supply system is decomposed and/or activated by the heating element kept at high temperatures to form a thin film on the substrate held by the substrate holder; the connection structure comprising:

one or a plurality of connection terminal holders placed in the processing container, each of the connection terminal holders holds a plurality of connection terminals at a predetermined position with electrical insulation therebetween; each of the connection terminals connects the heating element to the electric power supply mechanism electrically; the heating element connected to the connection terminals is supported facing the substrate holder; and a connection region of the heating element connected to the connection terminal is not exposed to a space in the processing container;

a connection pin is provided at an end portion of the heating element; and the connection terminal is provided with a pin receiver having a small hole, through which small hole the connection pin provided at the end portion of the heating element is inserted or removed and the inside diameter of the small hole is smaller than a diameter of the connection pin, and a slit extending laterally in a direction in which the connection pin is inserted or removed is provided on the peripheral wall of the said small hole forming the said small hole.

5. The connection structure between the heating element and the electric power supply mechanism in a heating element CVD system as claimed in claim 4, wherein the connection terminal has a connection terminal inside hollow portion provided on a side facing the inside of the processing container and communicating with the pin receiver through a heating element passing hole and a gas passing hole for making the connection terminal inside hollow portion communicate with the space in the processing container at a part facing the inside of processing container and in which the heating element connected to the connection terminal is passed through the gas passing hole in a noncontact manner thereby the connection region of the heating element connected to the connection terminal is prevented from being exposed to the space in the processing container, and wherein a spacer is interposed between the inside peripheral wall of the heating element passing hole and the connection pin at the end portion of the heating element, and the spacer is arranged on a side of an opening facing the connection terminal inside hollow portion of the heating element passing hole.

6. A connection structure between a heating element and an electric power supply mechanism in a heating element CVD system which comprises a processing container in which a predetermined processing is performed to a substrate held by a substrate holder disposed therein; an evacuation system which is connected to the processing container and evacuates the processing container to a vacuum; a raw material gas supply system for supplying a predetermined raw material gas into the processing container; and a heating element which is disposed in the processing container and is supplied with electric power from the electric power supply mechanism, thereby being heated to high temperatures; and wherein the raw material gas introduced into the processing container from the raw material gas supply system is decomposed and/or activated by the heating element kept at the high temperatures to form a thin film on the substrate held by the substrate holder; the connection structure comprising:

one or a plurality of connection terminal holders placed in the processing container, each of the connection terminal holders holds a plurality of connection terminals at a predetermined position with electrical insulation therebetween; each of the connection terminals connects the heating element to the electric power supply mechanism electrically; the heating element connected to the connection terminals is supported facing the substrate holder, wherein each of the connection terminal holders has a first inside hollow portion to which a gas introduction system for introducing gas is connected;

each of the plurality of connection terminals held at a predetermined position with electrical insulation therebetween has a connection terminal inside hollow portion provided on a side facing the inside of processing container and a gas passing hole which makes the connection terminal inside hollow portion communicate with the space in the processing container on a side facing the inside of processing container and through which the heating element connected to the connection terminal is passed in a noncontact manner thereby a connection region of the heating element connected to the connection terminal is prevented from being exposed to a space in the processing container;

wherein the connection terminal inside hollow portion is made to communicate with the first inside hollow portion of the connection terminal holder, a connection part between the connection terminal and the electric power supply mechanism, or the connection part between the connection terminal and the electric power supply mechanism and a wiring part for electrically connecting the connection terminal and the other connection terminal is arranged in the first inside hollow portion, and further comprising an insulator arranged so as to cover a part facing the first inside hollow portion of the connection part and the wiring part, or a surface of the connection terminal holder facing the first inside hollow portion is covered with an insulator.

7. The connection structure of claim 6, wherein the insulator is arranged so as to cover the part facing the first inside hollow portion of the connection part and the wiring part, and the surface of the connection terminal holder facing the first inside hollow portion is covered with the insulator.

8. The heating element CVD system of claim 1, wherein the shield plate is substantially planar.

* * * * *